US012660333B2

(12) United States Patent
    Fukushima

(10) Patent No.: US 12,660,333 B2
(45) Date of Patent: Jun. 16, 2026

(54) IMAGING ELEMENT WITH BONDED CHIPS OR SUBSTRATES AND METHOD FOR MANUFACTURING IMAGING ELEMENT

(71) Applicant: SONY SEMICONDUCTOR SOLUTIONS CORPORATION, Kanagawa (JP)

(72) Inventor: Kenta Fukushima, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 809 days.

(21) Appl. No.: 17/911,539

(22) PCT Filed: Feb. 8, 2021

(86) PCT No.: PCT/JP2021/004513
    § 371 (c)(1),
    (2) Date: Sep. 14, 2022

(87) PCT Pub. No.: WO2021/199679
    PCT Pub. Date: Oct. 7, 2021

(65) Prior Publication Data
    US 2023/0139201 A1      May 4, 2023

(30) Foreign Application Priority Data

Mar. 31, 2020    (JP) ................................. 2020-062765

(51) Int. Cl.
    *H10F 39/00*        (2025.01)
    *H10P 74/00*        (2026.01)
    (Continued)
(52) U.S. Cl.
    CPC ......... *H10F 39/016* (2025.01); *H10F 39/026* (2025.01); *H10P 74/238* (2026.01);
    (Continued)

(58) Field of Classification Search
    CPC ...... H10F 39/016; H10F 39/018; H10F 39/12; H10F 39/18; H10F 39/199; H10F 39/811;
    (Continued)

(56) References Cited

U.S. PATENT DOCUMENTS

| | | | |
|---|---|---|---|
| 9,054,005 B2 | 6/2015 | Tsukimura | |
| 2008/0128848 A1 | 6/2008 | Suzuki et al. | |

(Continued)

FOREIGN PATENT DOCUMENTS

| | | |
|---|---|---|
| JP | 2008-140819 | 6/2008 |
| JP | 2012-244100 | 12/2012 |

(Continued)

OTHER PUBLICATIONS

International Search Report and Written Opinion prepared by the Japan Patent Office on Apr. 6, 2021, for International Application No. PCT/JP2021/004513, 3 pgs.

*Primary Examiner* — Didarul A Mazumder
(74) *Attorney, Agent, or Firm* — SHERIDAN ROSS P.C.

(57) ABSTRACT

To prevent damage to an imaging element configured by bonding a plurality of semiconductor chips together. The imaging element includes a plurality of semiconductor chips each having a semiconductor substrate and a wiring region. One of the plurality of semiconductor chips is provided with a photoelectric conversion unit for performing photoelectric conversion of incident light. Two of the plurality of semiconductor chips are provided with first pads in which surfaces of wiring regions of the two semiconductor chips are bonded to each other and which are arranged on the surfaces of the wiring regions and bonded to each other. At least one of the two semiconductor chips is provided with a second pad arranged in the wiring region and having a (Continued)

protrusion formed thereon so as to face toward the bonded surface. The second pad is configured to have a size different from that of the first pad.

17 Claims, 17 Drawing Sheets

(51) Int. Cl.
    *H10W 72/00*         (2026.01)
    *H10W 72/50*         (2026.01)
    *H10W 72/90*         (2026.01)
(52) U.S. Cl.
    CPC ........... *H10W 72/50* (2026.01); *H10W 72/90*
        (2026.01); *H10W 72/075* (2026.01); *H10W*
        *72/932* (2026.01); *H10W 72/952* (2026.01)
(58) Field of Classification Search
    CPC ... H10F 39/8063; H10F 39/809; H01L 24/09;
        H01L 24/05; H01L 24/08; H01L 24/85;
        H01L 23/522; H01L 21/768; H01L
        2224/08145; H01L 21/50; H01L 24/46;
        H01L 25/065; H10P 74/273
    USPC ................................ 257/431; 438/48, 54, 69
    See application file for complete search history.

(56) References Cited

U.S. PATENT DOCUMENTS

| | | | | |
|---|---|---|---|---|
| 2010/0301444 A1* | 12/2010 | Koike | ................... | H10F 39/026 |
| | | | | 257/443 |
| 2012/0298993 A1 | 11/2012 | Nagata | | |
| 2013/0009321 A1* | 1/2013 | Kagawa | ................ | H01L 23/564 |
| | | | | 438/455 |
| 2014/0110811 A1* | 4/2014 | Tsukimura | ............ | H10F 39/811 |
| | | | | 257/443 |
| 2014/0284744 A1* | 9/2014 | Fujii | ................. | H01L 21/76823 |
| | | | | 438/57 |
| 2016/0233264 A1 | 8/2016 | Kagawa et al. | | |
| 2017/0033144 A1 | 2/2017 | Takahashi | | |
| 2018/0138223 A1* | 5/2018 | Kotoo | ................... | H10F 39/809 |
| 2019/0157333 A1* | 5/2019 | Tsai | ..................... | H10F 39/809 |
| 2019/0386056 A1* | 12/2019 | Fujii | .................... | H10F 39/018 |

FOREIGN PATENT DOCUMENTS

| | | |
|---|---|---|
| JP | 2014-086596 | 5/2014 |
| WO | WO 2015/050000 | 4/2015 |
| WO | WO 2015/159766 | 10/2015 |
| WO | WO 2019/087764 | 5/2019 |

* cited by examiner

K

L

IMAGING ELEMENT WITH BONDED CHIPS OR SUBSTRATES AND METHOD FOR MANUFACTURING IMAGING ELEMENT

CROSS REFERENCE TO RELATED APPLICATIONS

This application is a national stage application under 35 U.S.C. 371 and claims the benefit of PCT Application No. PCT/JP2021/004513, having an international filing date of 8 Feb. 2021, which designated the United States, which PCT application claimed the benefit of Japanese Patent Application No. 2020-062765, filed 31 Mar. 2020, the entire disclosures of each of which are incorporated herein by reference.

TECHNICAL FIELD

The present disclosure relates to an imaging element and a method for manufacturing the imaging element. More specifically, the present disclosure relates to an imaging element configured by bonding a plurality of semiconductor chips together and a method for manufacturing the imaging element.

BACKGROUND ART

Conventionally, small-size semiconductor elements each obtained by bonding a plurality of semiconductor chips together have been used. As a method for manufacturing such semiconductor elements, a method of manufacturing the same by bonding wafers to each other is used. This is a manufacturing method, called WoW (Wafer on Wafer), in which semiconductor wafers, having integrated circuits before fragmentation formed thereon, are bonded together, the bonded semiconductor chips are electrically connected, and the semiconductor chips are diced and fragmented. This is a manufacturing method that achieves excellent productivity because wafers are bonded together at one time in the wafer state. However, with this WoW method, a problem arises in that the yield is lowered. Defective chips, such as those that do not operate normally, are generated at a certain ratio in the semiconductor chips formed on the wafer before fragmentation. As a result of the wafers including the defective chips being bonded together, when at least one of the semiconductor chips is a defective chip, the entire fragmented semiconductor element becomes a defective product. Therefore, the yield of the semiconductor element that has undergone the bonding step is lower than the yield of a single wafer.

In contrast to such a WoW method, a manufacturing method in which a fragmented semiconductor chip is bonded to a wafer is also used. This semiconductor element manufacturing method is called CoW (Chip on Wafer). By inspecting each semiconductor chip region of the semiconductor chip and the wafer before bonding, and selecting non-defective chips, it is possible to prevent a decrease in yield. As such a semiconductor element, for example, an imaging element configured by bonding a semiconductor chip in which pixels for generating an image signal based on incident light are arranged and a semiconductor chip in which a processing circuit for processing an image signal is arranged is used. By bonding and integrating a plurality of semiconductor chips, the size of the imaging element can be reduced. An imaging element has been proposed in which semiconductor chips are selected by performing an electrical inspection on the semiconductor chips before bonding, and the semiconductor chips confirmed to be non-defective products are used for bonding (for example, see PTL 1).

CITATION LIST

Patent Literature

[PTL 1]
WO 2019/087764

SUMMARY

Technical Problem

In the above-mentioned conventional technique, a problem arises in that the imaging element is damaged when the semiconductor chips after the inspection are bonded. The inspection of the semiconductor chip is performed by detecting an electric signal of an inspection pad formed on the surface of the semiconductor chip. The electric signal can be detected by an inspection probe. A metal needle is arranged on the inspection probe, and the inspection probe is electrically connected to the inspection pad by bringing the tip of the needle into contact with the inspection pad. At this time, the needle of the inspection probe comes into contact with the inspection pad at a relatively high needle pressure. This is to reduce the electrical resistance between the inspection probe and the inspection pad by penetrating an oxide film or the like on the surface of the inspection pad. The contact of the needle of this inspection probe causes undulations on the surface of the inspection pad. When the semiconductor chips are bonded to each other, the opposing semiconductor chips may be damaged by the tip of the undulation, and the imaging element may be damaged.

The present disclosure has been made in view of the above-mentioned problems, and an object of the present disclosure is to prevent damage to an imaging element configured by bonding a plurality of semiconductor chips together.

Solution to Problem

The present disclosure has been made in order to solve the above-mentioned problems, and a first aspect thereof is an imaging element including: a plurality of semiconductor chips each having a semiconductor substrate and a wiring region and bonded to each other, wherein one of the plurality of semiconductor chips is provided with a photoelectric conversion unit for performing photoelectric conversion of incident light, two of the plurality of semiconductor chips are provided with first pads in which surfaces of wiring regions of the two semiconductor chips are bonded to each other and which are arranged on the surfaces of the wiring regions and bonded to each other at the time of the bonding, and at least one of the two semiconductor chips is provided with a second pad arranged in the wiring region and having a protrusion formed thereon so as to face toward the bonded surface, and the second pad is configured to have a size different from that of the first pad.

In the first aspect, the second pad may be configured to have a size larger than that of the first pad.

In the first aspect, the imaging element may further include an insulating film arranged between the second pad and the bonded surface.

In the first aspect, the insulating film may have an insulating material made of a silicon compound.

In the first aspect, the imaging element may further include a protective metal film arranged on a surface of the second pad.

In the first aspect, at least one of the plurality of semiconductor chips may further include a third pad for connecting to an external circuit.

In the first aspect, the third pad may be arranged in the same layer as the second pad.

In the first aspect, the second pad may be made of aluminum.

In the first aspect, the second pad may have the protrusion formed by inspection with a probing needle.

In the first aspect, the second pad may have a protrusion formed in a recess arranged on the bonded surface.

In the first aspect, the two semiconductor chips among the plurality of semiconductor chips may include respectively the second pads arranged so as to face each other.

In the first aspect, the first pad may be made of copper.

In the first aspect, the photoelectric conversion unit may be configured to perform photoelectric conversion of the incident light irradiated on a surface different from the surface on which the wiring region of the semiconductor chip is arranged.

In the first aspect, at least one of the plurality of semiconductor chips may be provided with a processing circuit configured to process an image signal generated based on the photoelectric conversion.

In the first aspect, the two semiconductor chips among the plurality of semiconductor chips may be respectively provided with the processing circuits and bonded to each other.

A second aspect of the present disclosure is a method for manufacturing an imaging element, including: a photoelectric conversion unit arrangement step of arranging a photoelectric conversion unit that performs photoelectric conversion of incident light on a semiconductor substrate; a second pad arrangement step of arranging a second pad in a wiring region, the second pad having a protrusion facing toward a bonded surface when wiring regions arranged on two semiconductor substrates are bonded; a first pad arrangement step of arranging first pads on the surface of the wiring region on which the second pad is arranged, the first pads being bonded to each other at the time of the bonding and having a size different from that of the second pad; a bonding step in which the wiring regions of the two semiconductor chips on which the first pads are arranged are bonded to each other and the first pads are bonded to each other.

In the second aspect, the method may further include an inspection step of performing inspection with the arranged second pad and forming the protrusion by the inspection, and the first pad arrangement step may involve arranging the first pads on the wiring region on which the second pad, on which the inspection has been performed, is arranged.

According to the aspects of the present disclosure, an insulating film is arranged on the surface of the inspection pad. It is assumed that the inspection pad will be protected after the inspection.

DESCRIPTION OF EMBODIMENTS

Figure 1:
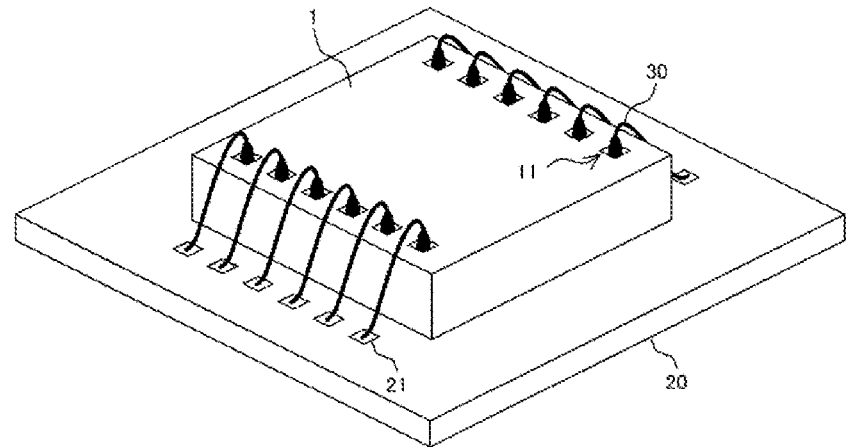
FIG. 1 is a diagram illustrating a configuration example of an imaging element according to an embodiment of the present disclosure.

Next, embodiments for implementing the present disclosure (hereinafter, referred to as embodiments) will be described with reference to the drawings. In the following drawings, the same or similar portions are denoted by the same or similar reference numerals and signs. In addition, the embodiments will be described in the following order.

1. First embodiment
2. Second embodiment
3. Third embodiment
4. Fourth embodiment
5. Example of application to camera 1. First Embodiment

[Appearance of Imaging Element]

FIG. 1 is a diagram illustrating a configuration example of an imaging element according to an embodiment of the present disclosure. The drawing is a view illustrating the appearance of the imaging element 1. The imaging element 1 in the drawing is configured as a semiconductor chip and is mounted as a bare chip on a substrate 20. The substrate 20 corresponds to a substrate or the like constituting a semiconductor package, and a pad 21 for transmitting a signal of the imaging element 1 is arranged. The imaging element 1 is attached to the substrate 20 and connected to the pad 21 by wire bonding. Specifically, the pad arranged on the imaging element 1 and the pad 21 of the substrate 20 are electrically connected by a bonding wire 30. The wire bonding pad of the imaging element 1 is arranged in the inner layer of the semiconductor chip constituting the imaging element 1, and the bonding wire is connected via an opening 11 formed on the upper surface of the imaging element 1. A pixel array portion 50, which will be described later, is arranged on the upper surface of the imaging element 1.

[Configuration of Imaging Element]

Figure 2:
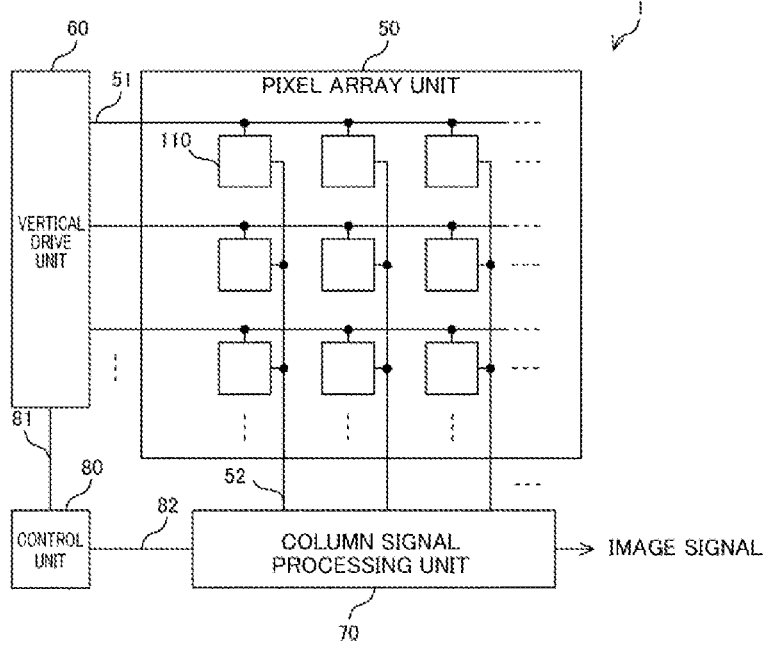
FIG. 2 is a diagram illustrating a configuration example of an imaging element according to an embodiment of the present disclosure.

FIG. 2 is a block diagram illustrating a configuration example of an imaging element according to an embodiment of the present disclosure. The imaging element 1 includes a pixel array portion 50, a vertical driving unit 60, a column signal processing unit 70, and a control unit 80.

The pixel array portion 50 is configured such that pixels 110 are disposed in a two-dimensional lattice form. Here, the pixels 110 generate an image signal corresponding to irradiated light. Each of the pixels 110 includes a photoelectric conversion unit that generates charge corresponding to irradiated light. In addition, each of the pixels 110 further includes a pixel circuit. The pixel circuit generates an image signal based on charge generated by the photoelectric conversion unit. The generation of the image signal is controlled by a control signal generated by the vertical driving unit 60, which will be described later. Signal lines 51 and 52 are disposed in an XY matrix form in the pixel array portion 50. The signal line 51, which is a signal line for transmitting a control signal of the pixel circuit in the pixel 110, is disposed for each row of the pixel array portion 50 and wired in common for the pixels 110 disposed in each row. The signal line 52, which is a signal line for transmitting an image signal generated by the pixel circuit of the pixel 110, is disposed for each column of the pixel array portion 50 and is wired in common for the pixels 110 disposed in each column. The photoelectric conversion unit and the pixel circuit are formed on a semiconductor substrate.

The vertical driving unit 60 generates a control signal of the pixel circuit of the pixel 110. The vertical driving unit 60 transmits the generated control signal to the pixels 110 through the signal lines 51 in the drawing. The column signal processing unit 70 processes image signals generated by the pixels 110. The column signal processing unit 70 processes the image signals transmitted from the pixels 110 through the signal lines 52 in the drawing. The processing in the column signal processing unit 70 corresponds to, for example, analog-to-digital conversion of converting an analog image signal generated in the pixels 110 into a digital image signal. The image signal processed by the column signal processing unit 70 is output as an image signal of the imaging element 1. The control unit 80 controls the imaging element 1 as a whole. The control unit 80 generates and outputs control signals for controlling the vertical driving unit 60 and the column signal processing unit 70 to control the imaging element 1. The control signals generated by the control unit 80 are transmitted to the vertical driving unit 60 and the column signal processing unit 70 through signal lines 81 and 82.

[Cross-Sectional Configuration of Imaging Element]

Figure 3:
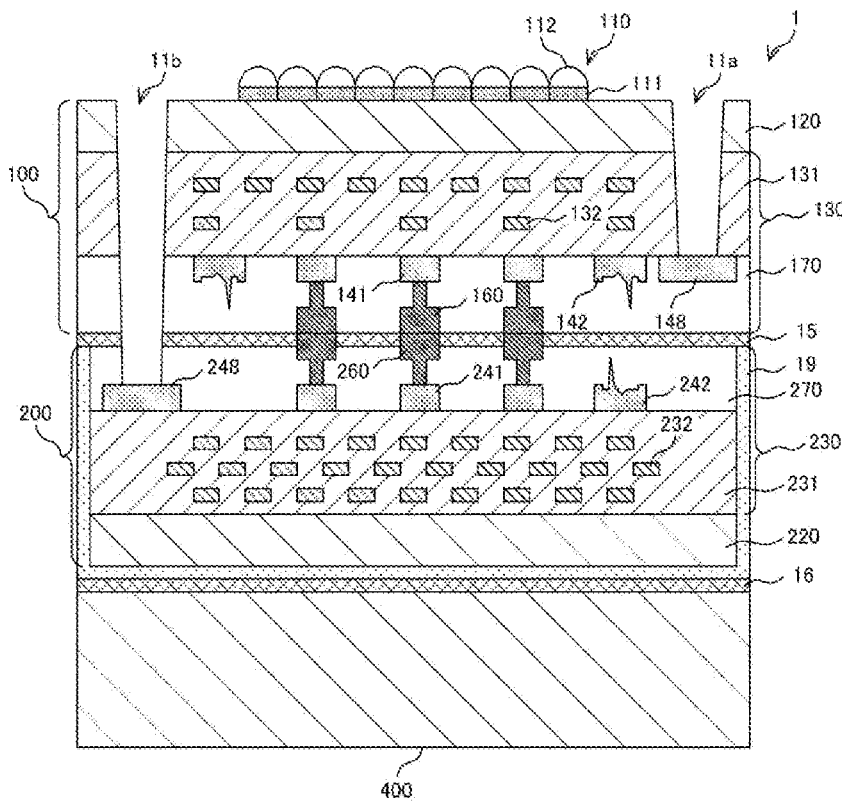
FIG. 3 is a diagram illustrating a configuration example of an imaging element according to a first embodiment of the present disclosure.

FIG. 3 is a diagram illustrating a configuration example of the imaging element according to the first embodiment of the present disclosure. The drawing is a schematic cross-sectional view illustrating a configuration example of the imaging element 1. The imaging element 1 is configured by bonding a plurality of semiconductor chips. Specifically, the imaging element 1 in the drawing includes an imaging chip 100 and a logic chip 200, and is configured by bonding these chips together. Further, the imaging element 1 further includes an oxide film 19, oxide film bonding layers 15 and 16, and a support substrate 400.

The imaging chip 100 is a semiconductor chip in which the pixel array portion 50 having the above-mentioned pixels 110 is arranged, and is a semiconductor chip that generates an image signal. The imaging chip 100 includes a semiconductor substrate 120 and a wiring region 130.

The semiconductor substrate 120 is a semiconductor substrate on which a photoelectric conversion unit of the pixel 110 and an element of a pixel circuit are formed. The semiconductor substrate 120 can be formed of, for example, silicon (Si). The photoelectric conversion unit is irradiated with incident light from the back surface side of the semiconductor substrate 120. A color filter 111 and an on-chip lens 112 are arranged for each pixel 110 on the back surface side of the semiconductor substrate 120. The imaging element 1 having such a configuration is referred to as a back-illuminated imaging element.

The wiring region 130 is a region in which wiring for transmitting a signal to an element arranged on the semiconductor substrate 120 is formed. The wiring region 130 is arranged on the surface side of the semiconductor substrate 120. The wiring region 130 includes an insulating layer 131 and a wiring layer 132. The wiring layer 132 is wiring that transmits a signal to an element arranged on the semiconductor substrate 120. The signal line 51 and the like described in FIG. 2 are formed of the wiring layer 132. The wiring layer 132 can be made of, for example, a metal such as copper (Cu). The insulating layer 131 insulates the wiring layer 132. The insulating layer 131 can be made of, for example, an insulating material such as a silicon oxide ($SiO_2$). The wiring layer 132 and the insulating layer 131 can be configured in multiple layers. The wiring layers 132 arranged in different layers can be connected to each other by a via-plug 133 described later.

Further, a pad is arranged in the wiring region 130. This pad is an electrode-shaped terminal made of a metal such as aluminum (Al). A pad 141, an inspection pad 142 and a bonding pad 148 are arranged as such pads.

The pad 141 is a pad connected to the wiring layer 132 and a signal is transmitted thereto. The pad 141 is a pad to which a surface pad 160 described later is connected.

The inspection pad 142 is a pad for inspecting the imaging chip 100. The inspection pad 142 is connected to the wiring layer 132 in the same manner as the pad 141, and a signal is transmitted thereto. The signal transmitted by the inspection pad 142 corresponds to a control signal for inspecting the imaging chip 100 and a signal generated by the imaging chip 100 during the inspection. The inspection pad 142 is formed with a protrusion (a protrusion 144 described later) facing toward the bonded surface when the imaging chip 100 and the logic chip 200 are bonded.

The inspection of the imaging chip 100 can be performed by, for example, a semiconductor test apparatus. The semiconductor test apparatus can input a control signal for inspection to the imaging chip 100 and detect an output signal such as an image signal from the imaging chip 100 to determine whether the imaging chip 100 is a non-defective product. By applying the imaging chip 100 determined to be a non-defective product to the imaging element 1, the yield of the imaging element 1 can be improved. The input of the control signal and the detection of the output signal can be performed by the inspection probe. A metal needle is arranged on this inspection probe. By touching the inspection pad 142 with the inspection probe, the needle of the inspection probe and the inspection pad 142 are electrically connected to each other, and a signal for inspection can be transmitted. At the time of this touching, the tip of the needle comes into contact with the inspection pad 142. A film such as an oxide is formed on the surface of the inspection pad 142. The needle of the inspection probe is brought into contact with the inspection pad 142 by a relatively high pressure so that it penetrates this film and comes into contact with the metal portion of the inspection pad 142. Therefore, a needle mark remains on the surface of the inspection pad 142 after the inspection. That is, unevenness as illustrated in the drawing is formed on the surface of the inspection pad 142 after the inspection.

The bonding pad 148 is a pad to which the bonding wire 30 described in FIG. 1 is connected. On the back surface of the bonding pad 148, an opening 11a penetrating the semiconductor substrate 120 and the wiring region 130 from the back surface side of the imaging chip 100 is arranged. Wire bonding is performed through the opening 11a.

The insulating film 170 is a film that insulates the inspection pad 142. Further, the insulating film 170 is arranged between the inspection pad 142 and the bonded surface to protect the inspection pad 142. The insulating film 170 can be made of an insulating material. Specifically, the insulating film 170 can be made of an oxide such as $SiO_2$. Further, the insulating film 170 may be configured to include a nitride such as a silicon nitride (SiN). As described above, unevenness is formed on the surface of the inspection pad 142 after the inspection. If this protrusion interferes with the pad or the like of the opposite logic chip 200, the semiconductor chip may be damaged or a malfunction may occur due to signal leakage. Therefore, the inspection pad 142 is arranged at a position deep from the front surface of the imaging chip 100 and is covered with the insulating film 170. Thus, it is possible to prevent the occurrence of problems such as damage to the logic chip 200.

The surface pad 160 is a pad arranged on the surface of the wiring region 130 to transmit a signal. The surface pad 160 in the drawing illustrates an example in which the surface pad 160 is arranged on the surface of the wiring region 130 via the pad 141 and a signal is transmitted thereto. Further, the surface pad 160 is bonded to the surface pad (a surface pad 260 described later) of the logic chip 200 when the imaging chip 100 and the logic chip 200 are bonded together. A signal can be transmitted between the imaging chip 100 and the logic chip 200 via the bonded surface pad 160 and surface pad 260. The surface pad 160 can be made of Cu. As will be described later, the surface pad 160 can be configured to have a different size from the inspection pad 142.

The pad 141, the inspection pad 142, the bonding pad 148, and the surface pad 160 can also be regarded as a part of the wiring arranged in the wiring region 130. Further, the insulating film 170 can be regarded as a part of the insulating layer arranged in the wiring region 130. The surface pad is an example of a first pad described in the claims. The inspection pad 142 is an example of a second pad described in the claims. The bonding pad 148 is an example of a third pad described in the claims.

The logic chip 200 is a semiconductor chip in which a processing circuit for processing an image signal generated by the imaging chip 100 is arranged. Further, a control circuit for generating a control signal of the imaging chip 100 can be arranged on the logic chip 200. The vertical driving unit 60, the column signal processing unit 70, and the control unit 80 described in FIG. 2 can be arranged on the logic chip 200. The logic chip 200 includes a semiconductor substrate 220 and a wiring region 230.

The semiconductor substrate 220 is a semiconductor substrate, like the semiconductor substrate 120. Elements such as the vertical driving unit 60 and the column signal processing unit 70 can be formed on the semiconductor substrate 220.

Similarly to the wiring region 130, the wiring region 230 is a region in which wiring for transmitting signals to the elements arranged on the semiconductor substrate 220 is formed, and includes an insulating layer 231 and a wiring layer 232.

Further, a pad 241 and an inspection pad 242 and a bonding pad 248 are arranged in the wiring region 230. The pad 241 is a pad to which a signal is transmitted, similarly to the pad 141. The inspection pad 242, like the inspection pad 142, is a pad to which a signal for inspection of the logic chip 200 is transmitted. The bonding pad 248 is a pad to which the bonding wire 30 is connected, similarly to the bonding pad 148. Unlike the bonding pad 148, an opening 11b is formed on the surface of the bonding pad 248. The opening 11b is an opening that penetrates the imaging chip 100 and the insulating film 270 described later. Wire bonding of the bonding pad 248 arranged on the logic chip 200 is performed through the opening 11b. The pad 241 and the inspection pad 242 and the bonding pad 248 can be made of Al.

The insulating film 270 is a film that insulates and protects the inspection pad 242, similarly to the insulating film 170. This insulating film 270 can be formed of an oxide such as $SiO_2$ or a nitride such as SiN.

Similarly to the surface pad 160, the surface pad 260 is a pad arranged on the surface of the wiring region 230 to transmit a signal, and is a pad bonded to the surface pad 160. The surface pad 260 can be made of Cu.

The pad 241 and the inspection pad 242, the bonding pad 248, and the surface pad 260 can also be regarded as a part of the wiring arranged in the wiring region 230. Further, the insulating film 270 can be regarded as a part of the insulating layer arranged in the wiring region 230. The surface pad 260 is an example of a first pad described in the claims. The inspection pad 242 is an example of a second pad described in the claims. The bonding pad 248 is an example of a third pad described in the claims.

The oxide film bonding layer 15 is arranged between the imaging chip 100 and the logic chip 200 to bond the imaging chip 100 and the logic chip 200. The oxide film bonding layer 15 is formed of an oxide such as $SiO_2$, and the imaging chip 100 and the logic chip 200 are bonded by the oxide film bonding. In this oxide film bonding, the surface of an oxide such as SiO₂ is activated by plasma treatment or the like, and the activated oxide films are bonded by heat and pressure contact. In the imaging element 1 of the drawing, the oxide film bonding is performed between the oxide film bonding layer 15 arranged on the surface of the wiring region 230 of the logic chip 200 and the wiring region 130 of the imaging chip 100. When the surfaces of the insulating film 170 of the imaging chip 100 and the insulating film 270 of the logic chip 200 are formed of oxides, the oxide film bonding layer 15 may be omitted, and the oxide film bonding may be performed between the insulating films 170 and 270. The oxide film 19 is an oxide film that surrounds the logic chip 200. The oxide film 19 protects the logic chip 200. The oxide film 19 can be made of SiO₂.

The support substrate 400 is a substrate that supports the imaging chip 100 and the logic chip 200. A Si substrate can be used for the support substrate 400. The support substrate 400 is bonded to the logic chip 200 by the oxide film bonding layer 16.

As described above, the insulating film 170 of the imaging chip 100 and the insulating film 270 of the logic chip 200 are bonded via the oxide film bonding layer 15. At this time, the facing surface pads 160 and 260 are bonded by being aligned and heat-pressed. As a result, the imaging chip 100 and the logic chip 200 can be bonded together. In the imaging chip 100 and the logic chip 200, the wiring region 130 and the wiring region 230 are bonded to each other via the oxide film bonding layer 15 and the insulating films 170 and 270.

By arranging the inspection pads 142 and 242 at positions deep from the bonded surface of the imaging chip 100 and the logic chip 200 and arranging the insulating films 170 and 270, contact with the opposing semiconductor chips and the like can be prevented. Therefore, the inspection pads 142 and 242 can be arranged at opposite positions on the bonded imaging chip 100 and logic chip 200. The inspection pads 142 and 242 on the right side of the drawing illustrate this opposite situation. It should be noted that, as in the inspection pad 142 on the left side of the drawing, it is possible to configure the configuration in which the opposing inspection pads 242 are not arranged.

[Configuration of Pad]

Figure 4:
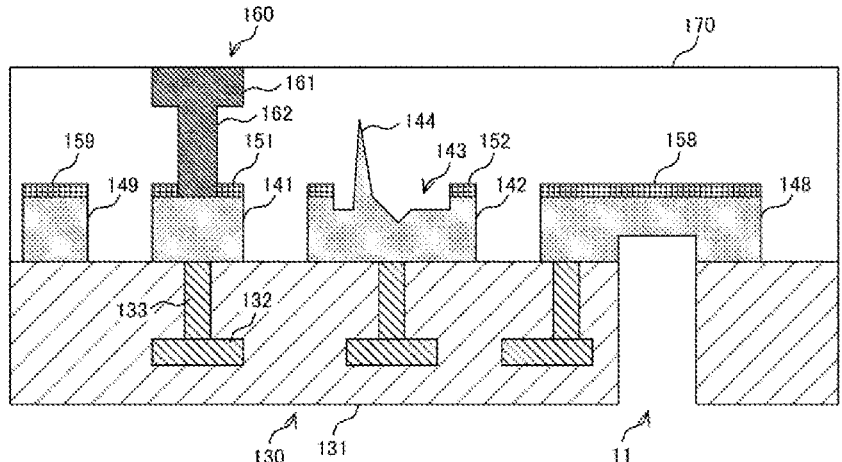
FIG. 4 is a diagram illustrating an example of the configuration of a pad according to a first embodiment of the present disclosure.

FIG. 4 is a diagram illustrating a configuration example of a pad according to the first embodiment of the present disclosure. The drawing is a schematic cross-sectional view illustrating a configuration example of the inspection pad 142 and the like. As illustrated in the drawing, the pad 141, the inspection pad 142, and the bonding pad 148 can be arranged in the same layer in the wiring region 130. Further, the pad 141, the inspection pad 142, and the bonding pad 148 are each connected to the wiring layer 132. The pad 141 and the like and the wiring layer 132 are connected by the via-plug 133. The via-plug 133 is made of columnar metal and connects wiring layers 132 of different layers and the wiring layer 132 and the pad 141, for example.

Further, a protective metal film can be arranged on the surfaces of the pad 141, the inspection pad 142 and the bonding pad 148. This protective metal film is a metal film that protects the pad 141 and the like, and can be formed of a laminated film of titanium (Ti) and titanium nitride (TiN). Further, a laminated film of tantalum (Ta) and tantalum nitride (TaN) can also be used. A protective metal film 151 is arranged on the surface of the pad 141, a protective metal film 152 is arranged on the surface of the inspection pad 142, and a protective metal film 158 is arranged on the surface of the bonding pad 148.

A surface pad 160 is arranged on the surface of the pad 141. The surface pad 160 is formed of a pad 161 and a via-plug 162. The pad 161 is a pad embedded in the insulating film 170, and is a pad adjacent to the surface of the wiring region 130. The via-plug 162 is a via-plug connecting the pads 141 and 161. The drawing illustrates an example in which one via-plug 162 is arranged between the pads 141 and 161. A plurality of via-plugs 162 may be arranged between the pads 141 and 161.

The pad 161 and the via-plug 162 can be made of Cu and can be formed at the same time. For example, the pad 161 and the via-plug 162 can be formed by Cu plating. Specifically, it can be formed by the following procedure. First, an opening in the shape of the pad 161 and the via-plug 162 is formed in the insulating film 170. Next, a protective layer (not illustrated) for preventing the diffusion of Cu is formed in this opening. Next, a seed layer (not illustrated) is arranged adjacent to the insulating film to perform plating, and a Cu film is arranged on the surface of the insulating film 170 including the opening. After that, the surface pad 160 can be formed by grinding the Cu film on the surface of the insulating film 170 to remove Cu other than the opening. Grinding of Cu can be performed by chemical mechanical polishing (CMP). When forming this opening, the protective metal film 151 is removed.

As described above, the inspection pad 142 is a pad with which the needle of the inspection probe is brought into contact. The protrusion 144 is formed on the inspection pad 142 by the contact of the needle of the inspection probe. By arranging the inspection pad 142 at a position deeper than the surface of the surface pad 160, it is possible to prevent the protrusion 144 from coming into contact with the logic chip 200 to be bonded. Further, by arranging the insulating film 170, the inspection pad 142 on which the protrusion 144 is formed can be protected. The insulating film 170 can also protect the logic chip 200 from the protrusion 144 of the inspection pad 142.

The inspection pad 142 in the drawing illustrates an example in which a recess 143 is formed in the region where the needle of the inspection probe is in contact. By arranging the recess 143, the tip position of the protrusion 144 after the inspection can be arranged at a position further deeper than the surface of the surface pad 160, and a margin can be secured.

As described above, the bonding pad 148 is a pad to which the bonding wire 30 is connected. An opening 11 is formed on the back side of the bonding pad 148. When forming the opening 11, a portion of the bonding pad 148 is removed to form a recess.

In addition, a simulated pad 149 is arranged in the drawing. The simulated pad 149 is a pad on which a signal is not transmitted and is not connected to the wiring layer 132. The simulated pad 149 corresponds to a so-called dummy pad, and is a pad that is arranged in a region where the pad 141 or the like is not arranged and is used to make the film thickness of the insulating film 170 or the like uniform. A protective metal film 159 is arranged on the surface of the simulated pad 149.

The simulated pad 149, pad 141, surface pad 160, inspection pad 142 and bonding pad 148 can be configured in different sizes. The inspection pad 142 can be configured to have a relatively large size in a plan view so that the inspection pad 142 is brought into contact with the needle of the inspection probe. On the other hand, the surface pad 160 is configured to have a relatively small size. This is to reduce the dishing during CMP in the manufacturing step described later. The pad 141 on which the surface pad 160 is arranged is also configured to have a relatively small size. Therefore, the inspection pad 142 can be configured to have a size larger than that of the surface pad 160. Further, the bonding pad 148 is configured to have a relatively large size for wire bonding. The simulated pad 149 can be configured as, for example, a pad having a width of approximately 3 μm. Further, the pad 141 and the surface pad 160 can be configured to have a width of, for example, approximately 5 μm. Further, the inspection pad 142 can be configured to have a width of, for example, 50 μm or less. Further, the bonding pad 148 can be configured to have a width of, for example, 50 to 100 μm. In this way, the size can be configured according to the purpose of use of each pad.

[Inspection in Inspection Pad]

Figure 5:
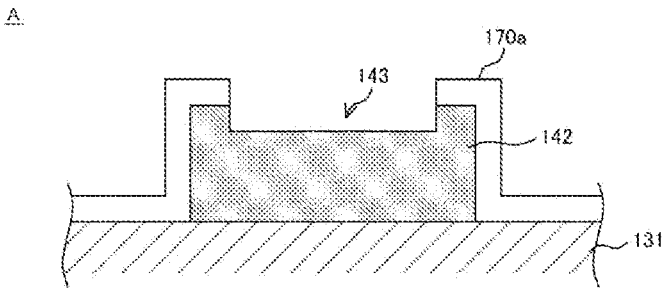
FIG. 5 is a diagram illustrating an example of inspection according to the embodiment of the present disclosure.
Figure 5:
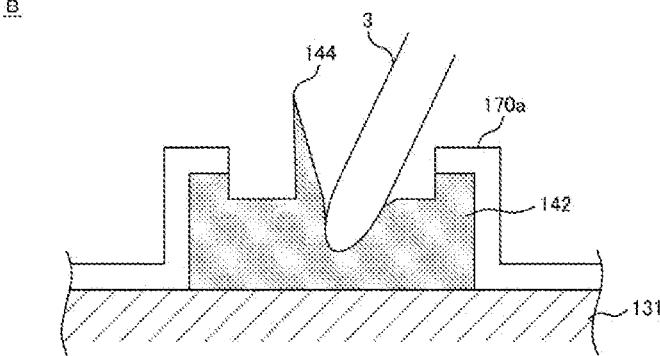
Figure 5:
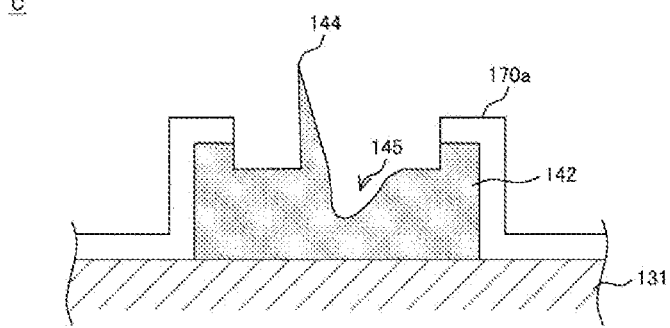

FIG. 5 is a diagram illustrating an example of inspection according to the embodiment of the present disclosure. The drawing is a diagram illustrating the state of inspection in the inspection pad 142. In the drawing, the illustration of the protective metal film 152 is omitted.

A in the drawing is a drawing illustrating the inspection pad 142 before inspection. A recess 143 is formed on the surface of the inspection pad 142. A thin insulating film 170*a* is arranged on the surface and side surfaces of the inspection pad 142 in the region other than the recess 143.

B in the drawing is a drawing illustrating the inspection pad 142 at the time of inspection. At the time of inspection, the needle 3 of the inspection probe is brought into contact with the recess 143 of the inspection pad 142. At this time, the tip of the needle 3 pierces the surface of the inspection pad 142. As a result, Al constituting the inspection pad 142 swells to form the protrusion 144.

C in the drawing is a drawing illustrating the inspection pad 142 after inspection. The needle 3 of the inspection probe is removed, and a recess 145 of the needle mark is formed on the surface of the inspection pad 142. By performing the inspection in this way, the protrusion 144 is formed on the inspection pad 142.

[Method for Manufacturing Imaging Chip]

FIGS. 6 to 9 are diagrams illustrating an example of a method for manufacturing the imaging chip according to the first embodiment of the present disclosure. FIGS. 6 to 9 are diagrams illustrating an example of a manufacturing process of the imaging chip 100. The semiconductor chip manufacturing step according to the embodiment of the present disclosure will be described by taking the imaging chip 100 as an example.

Figure 6:
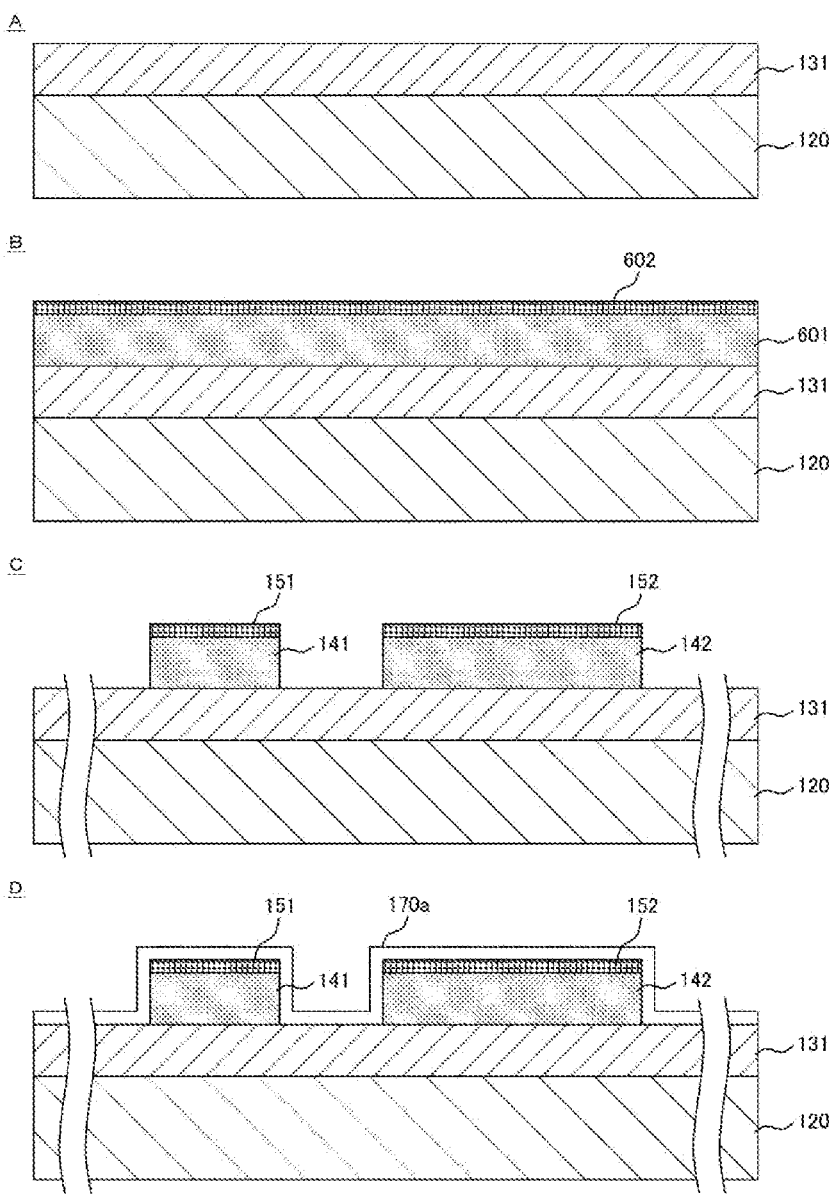
FIG. 6 is a diagram illustrating an example of a method for manufacturing the imaging chip according to the first embodiment of the present disclosure.

First, an element such as a photoelectric conversion unit is formed on a wafer-shaped semiconductor substrate 120 to form an insulating layer 131 and a wiring layer 132 (not illustrated) in the wiring region 130 (A in FIG. 6). This step is an example of a photoelectric conversion unit arrangement step described in the claims.

Next, a material film 601 of the pad 141 and the like is formed on the surface of the insulating layer 131. This can be done, for example, using sputtering or the like to form an Al film. Next, a material film 602 of the protective metal film 151 and the like is formed. This can be done, for example, by laminating the Ti and TiN films using sputtering or the like (B in FIG. 6).

Next, the pad 141 and the inspection pad 142 are formed. This can be done by arranging a resist on a region of the surface of the material film 602 where the pads 141 and the like are arranged, and using this resist as a mask to etch the material films 601 and 602 other than the region where the pads 141 are arranged (C in FIG. 6). This step is an example of a second pad arrangement step described in the claims.

Next, a thin insulating film 170*a* is arranged on the surface of the wiring region 130 including the pad 141 and the like. This can be done, for example, using CVD (Chemical Vapor Deposition) to form a film of $SiO_2$ which is a material of the insulating film 170*a* (D in FIG. 6).

Next, the insulating film 170*a* and the protective metal film 152 at the center of the surface of the inspection pad 142 are removed. This can be done by dry etching. During this etching, the recess 143 can be formed (E in FIG. 7).

Next, the wafer-shaped imaging chip 100 is inspected. The needle 3 of the inspection probe is brought into contact with the inspection pad 142 to input and output an inspection signal. At this time, the protrusion 144 is formed (F in FIG. 7). The step is an example of an inspection step described in the claims. The position of a non-defective chip among the wafer-shaped imaging chips 100 after the inspection is acquired. As a result, a non-defective imaging chip 100 is selected (G in FIG. 7).

Next, the insulating film 170 (insulating film 170*b*) is arranged on the surface of the insulating layer 131. The insulating film 170*b* is an insulating film having a thickness that covers the pad 141 and the inspection pad 142 (H in FIG. 8).

Next, openings 603 and 604 are formed in the insulating film 170 adjacent to the pad 141. The openings 603 and 604 are openings corresponding to the via-plug 162 and the pad 161 respectively. This can be done, for example, using dry etching to remove the insulating film 170 in the regions of the openings 603 and 604 (I in FIG. 8).

Next, a material film 605 of the surface pad 160 is arranged on the surface of the insulating film 170. At this time, the material film 605 is also arranged at the openings 603 and 604. This can be done by forming a Cu film by plating (J in FIG. 9). Next, the material film 605 arranged on the surface of the insulating film 170, excluding the openings 603 and 604, is removed. This can be done by CMP. In this way, the via-plug 162 and the pad 161 can be formed, and the surface pad 160 can be formed (K in FIG. 9). This step is an example of a first pad arrangement step described in the claims.

By the above steps, the wafer-shaped imaging chip 100 can be manufactured. A wafer-shaped logic chip 200 can be formed by the same step. After that, the logic chip 200 can be fragmented into individual pieces by dicing the wafer-shaped logic chip 200. It should be noted that the fragmentation of the imaging chip 100 can be performed after the logic chips 200 are bonded together.

[Method for Manufacturing Imaging Element]

FIGS. 10 to 13 are diagrams illustrating an example of a method for manufacturing the imaging element according to the first embodiment of the present disclosure. FIGS. 10 to 13 are diagrams illustrating an example of a manufacturing process of the imaging element 1.

First, the logic chip 200 determined to be a non-defective product as a result of the inspection is arranged on a rearrangement substrate 606. At this time, a plurality of logic chips 200 are arranged so as to be aligned with the wafer-shaped imaging chip 100. The logic chip 200 can be fixed by an adhesive 607 arranged on the rearrangement substrate 606 (A in FIG. 10).

Next, the support substrate 608 on which the oxide film bonding layer 15 is arranged is arranged and bonded to the surface of the insulating film 270 of the logic chip 200. This can be done by oxide film bonding (B in FIG. 10).

Figure 10:
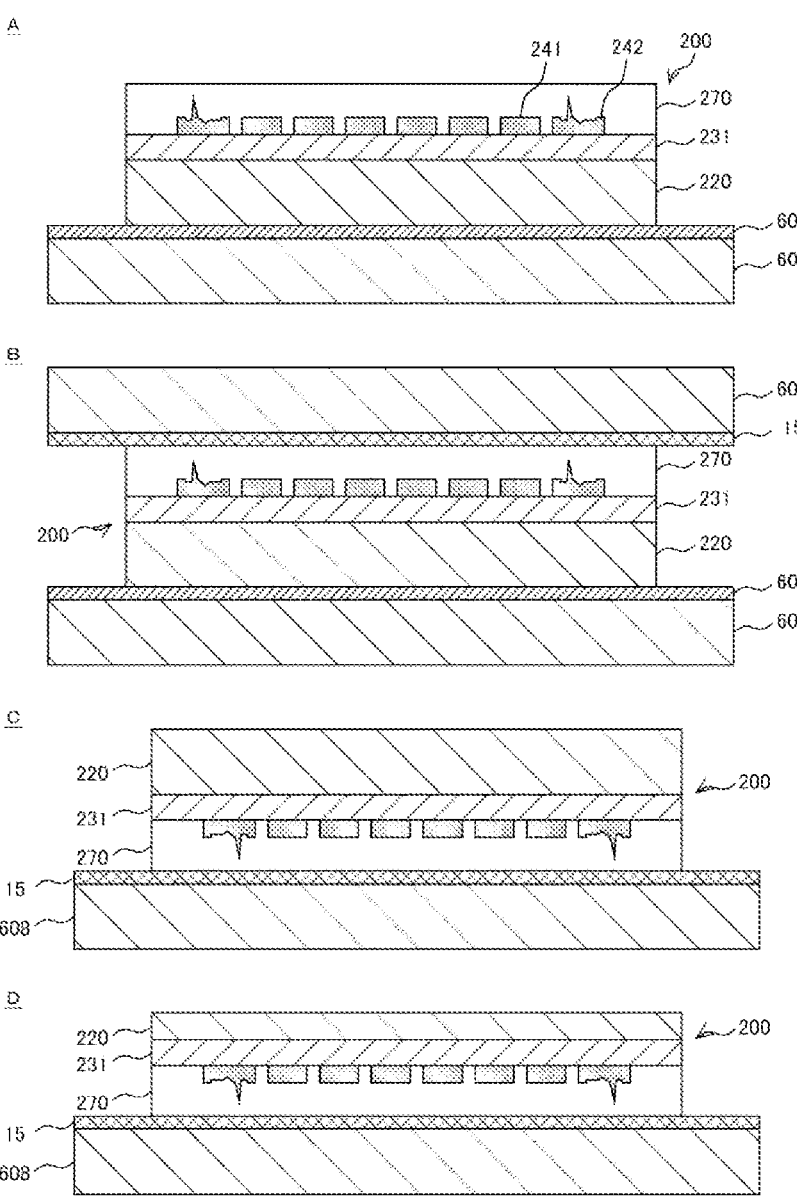
FIG. 10 is a diagram illustrating an example of a method for manufacturing an imaging element according to the first embodiment of the present disclosure.
Figure 11:
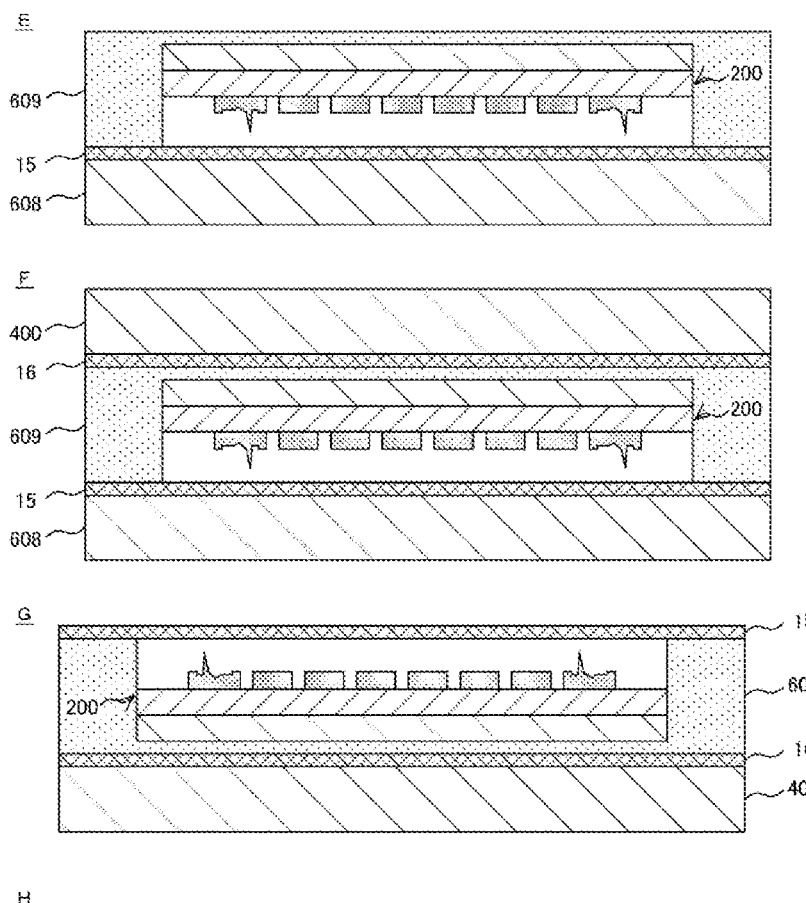
FIG. 11 is a diagram illustrating an example of a method for manufacturing an imaging element according to the first embodiment of the present disclosure.
Figure 11:
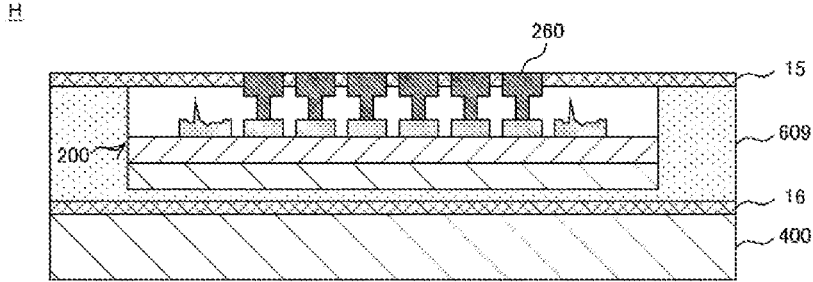

Next, the top and bottom of the support substrate 608 on which the logic chip 200 is arranged is inverted to remove the rearrangement substrate 606 and the adhesive 607 (C in FIG. 10).

Next, the back surface side of the semiconductor substrate 220 is ground to make it thinner. This can be done, for example, by CMP (D in FIG. 10).

Next, the oxide film 609 is arranged around the logic chip 200. This can be done, for example, by arranging a SiO₂ film using CVD. Next, the surface of the oxide film 609 is ground and flattened (E in FIG. 11).

Next, the support substrate 400 in which the oxide film bonding layer 16 is arranged is bonded to the surface of the oxide film 609. This can be done by oxide film bonding (F in FIG. 11).

Next, the support substrate 608 is removed by inverting the top and bottom of the support substrate 400. This can be done, for example, by etching the support substrate 608 (G in FIG. 11).

Next, the surface pad 260 is arranged on the logic chip 200. This can be done by the steps represented by I in FIG. 8 to K in FIG. 9 (H in FIG. 11).

Next, the imaging chip 100 is bonded to the logic chip 200. This can be done by bonding the wafer-shaped imaging chip 100 described with reference to K in FIG. 9 to the logic chip 200 arranged on the support substrate 400. This bonding is performed by oxide film bonding (I in FIG. 12). The step is an example of a bonding step described in the claims.

Figure 12:
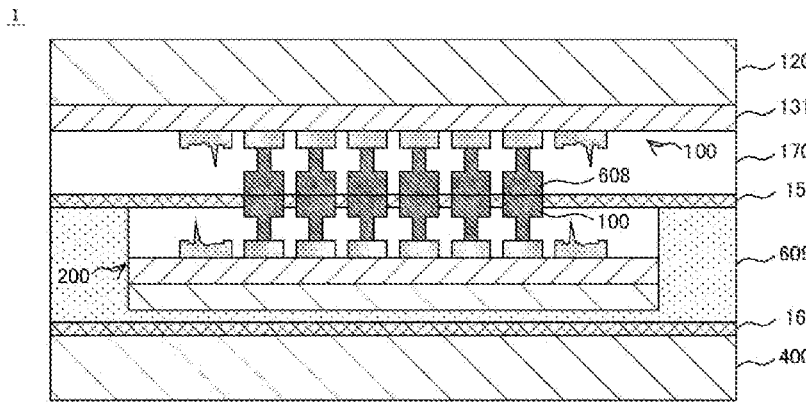
FIG. 12 is a diagram illustrating an example of a method for manufacturing the imaging element according to the first embodiment of the present disclosure.
Figure 12:
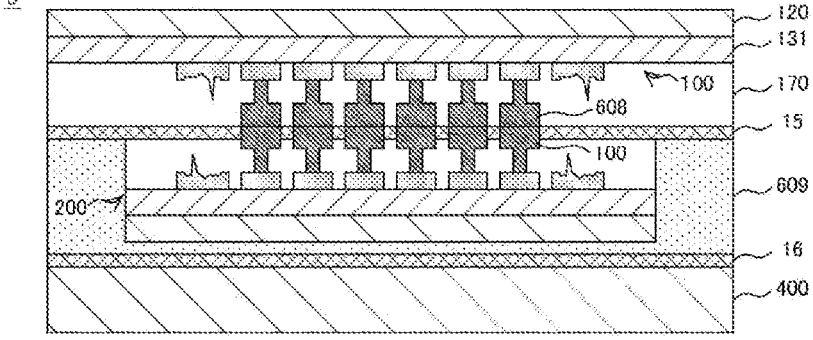

Next, the back surface side of the semiconductor substrate 120 of the imaging chip 100 is ground to be thinned (see J in FIG. 12).

Figure 13:
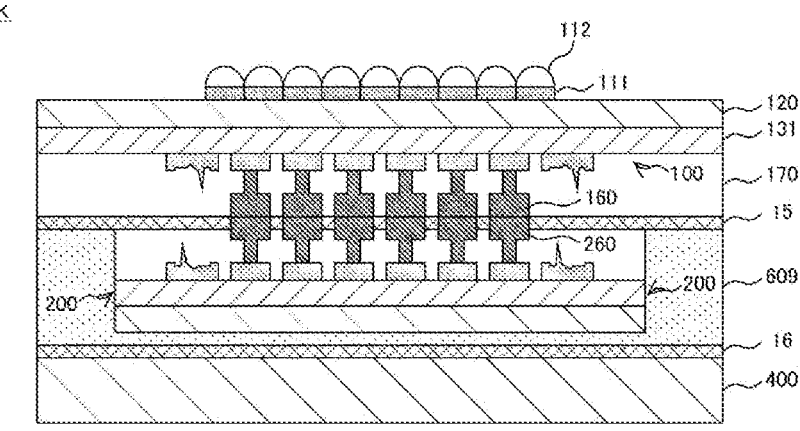
FIG. 13 is a diagram illustrating an example of a method for manufacturing the imaging element according to the first embodiment of the present disclosure.
Figure 13:
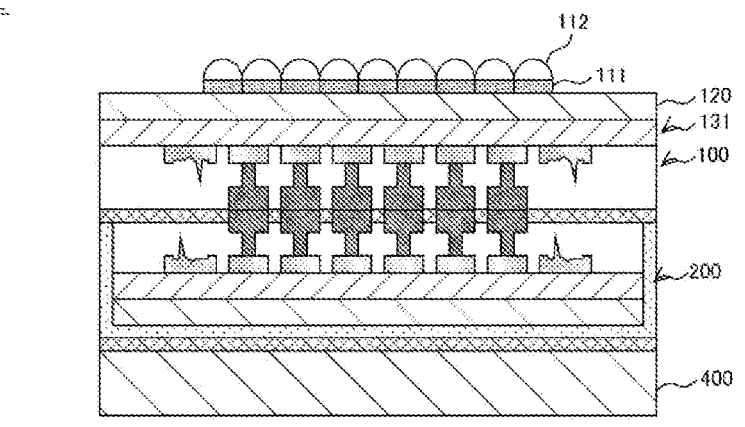

Next, the color filter 111 and the on-chip lens 112 are arranged for each pixel 110 on the semiconductor substrate 120 of the imaging chip 100 (K in FIG. 13). In addition, an opening 11 (not illustrated) is formed.

Next, the bonded imaging chip 100 and logic chip 200 are fragmented into individual pieces (L in FIG. 13). In this way, the imaging element 1 can be manufactured.

[Another Configuration of Imaging Element]

Figure 14:
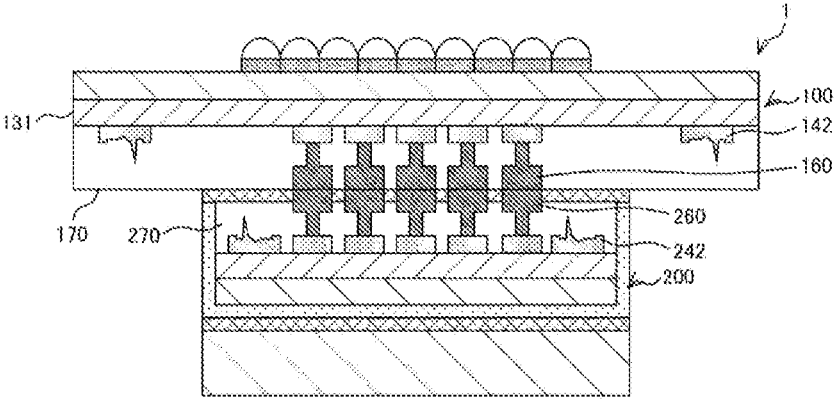
FIG. 14 is a diagram illustrating a configuration example of an imaging element according to the first embodiment of the present disclosure.

FIG. 14 is a diagram illustrating another configuration example of the imaging element according to the first embodiment of the present disclosure. The drawing is a schematic cross-sectional view illustrating a configuration example of the imaging element 1, similarly to FIG. 3. The difference from the imaging element 1 of FIG. 3 is that the imaging chip 100 and the logic chip 200 have different sizes.

The logic chip 200 in the drawing illustrates an example in which the size is smaller than that of the imaging chip 100. An inspection pad 242 is arranged on the logic chip 200, and an insulating film 270 is arranged between the inspection pad 142 and the surface on the back side of the logic chip 200.

In the imaging chip 100 of the drawing, the inspection pad 142 can be arranged at a position not facing the logic chip 200.

As described above, in the imaging element 1 of the first embodiment of the present disclosure, the needle 3 of the inspection probe comes into contact with the inspection pads 142 and 242 arranged in the wiring regions of the imaging chip 100 and the logic chip 200, respectively, and the inspection is performed. The imaging chip 100 and the logic chip 200 after this inspection are bonded together to form the imaging element 1. Prior to this bonding, a surface pad 160 or the like is arranged on the surface of the wiring region to raise the surface of the wiring region. It is possible to prevent the imaging element 1 from being damaged by the protrusions formed on the surfaces of the inspection pads 142 and

242 when they are bonded together. Thus, it is possible to arrange the inspection pads 142 and 242 on the bonded surface between the imaging chip 100 and the logic chip 200.

2. Second Embodiment

In the imaging element 1 of the first embodiment described above, the needle 3 of the inspection probe is in contact with the surface of the inspection pad 142. On the other hand, the imaging element 1 of the second embodiment of the present disclosure is different from that of the first embodiment in that a protective metal film is arranged on the surface of the inspection pad 142, and the needle 3 of the inspection probe is brought into contact with the protective metal film.

[Configuration of Pad]

Figure 15:
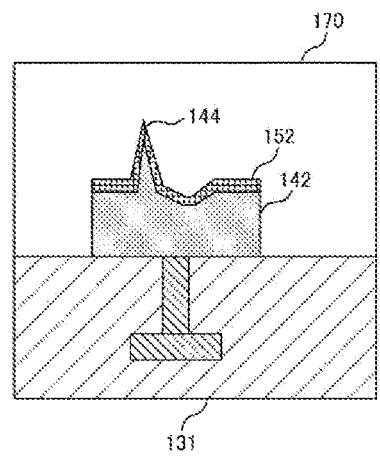
FIG. 15 is a diagram illustrating a configuration example of a pixel according to a second embodiment of the present disclosure.

FIG. 15 is a diagram illustrating a configuration example of an inspection pad according to the second embodiment of the present disclosure. The drawing is a schematic cross-sectional view illustrating a configuration example of the inspection pad 142 similarly to Fig. The difference from the inspection pad 142 described in FIG. 5 is that the protective metal film 152 is also arranged on the surface of the recess 143.

Figure 7:
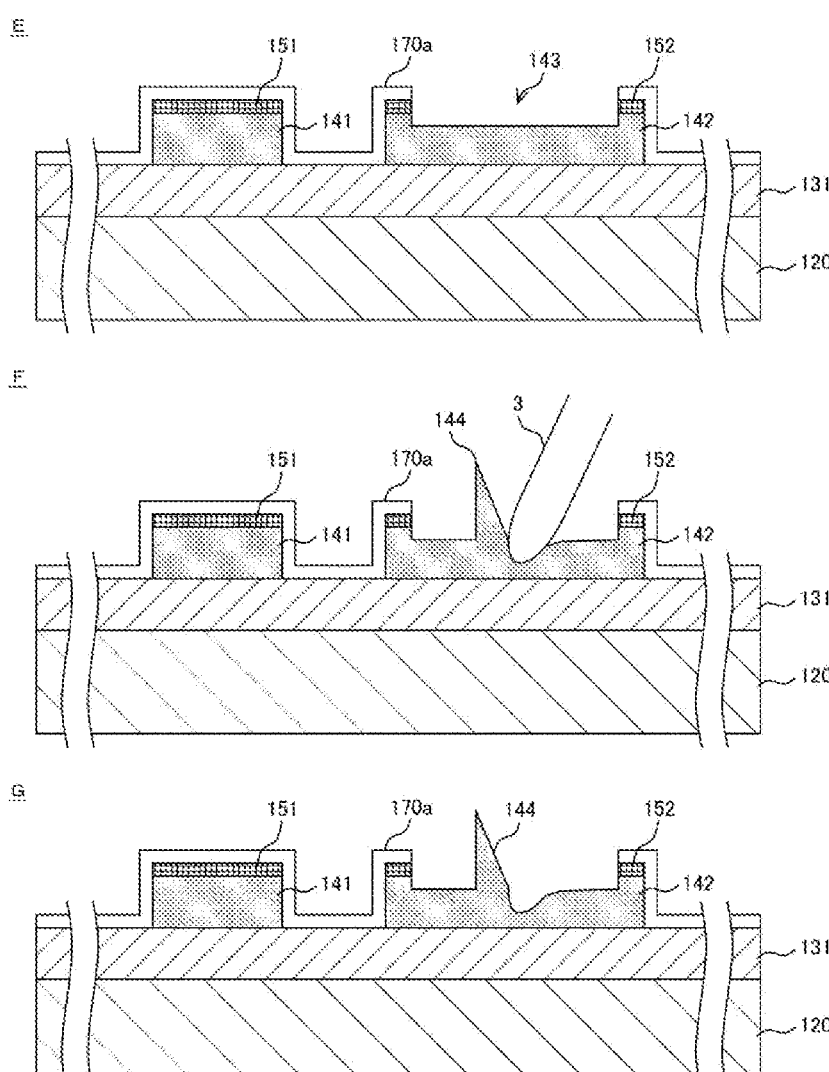
FIG. 7 is a diagram illustrating an example of a method for manufacturing the imaging chip according to the first embodiment of the present disclosure.
Figure 8:
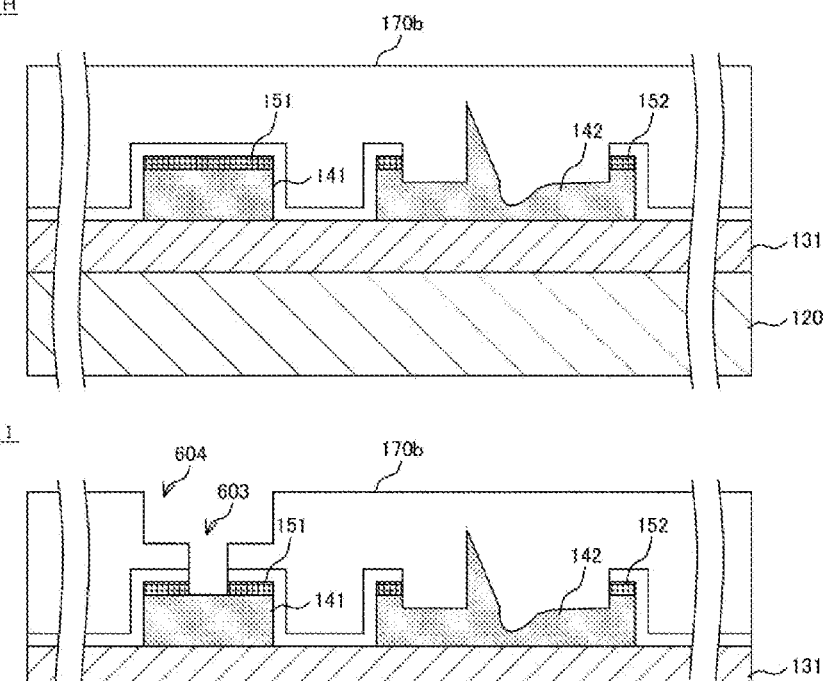
FIG. 8 is a diagram illustrating an example of a method for manufacturing an imaging chip according to the first embodiment of the present disclosure.
Figure 9:
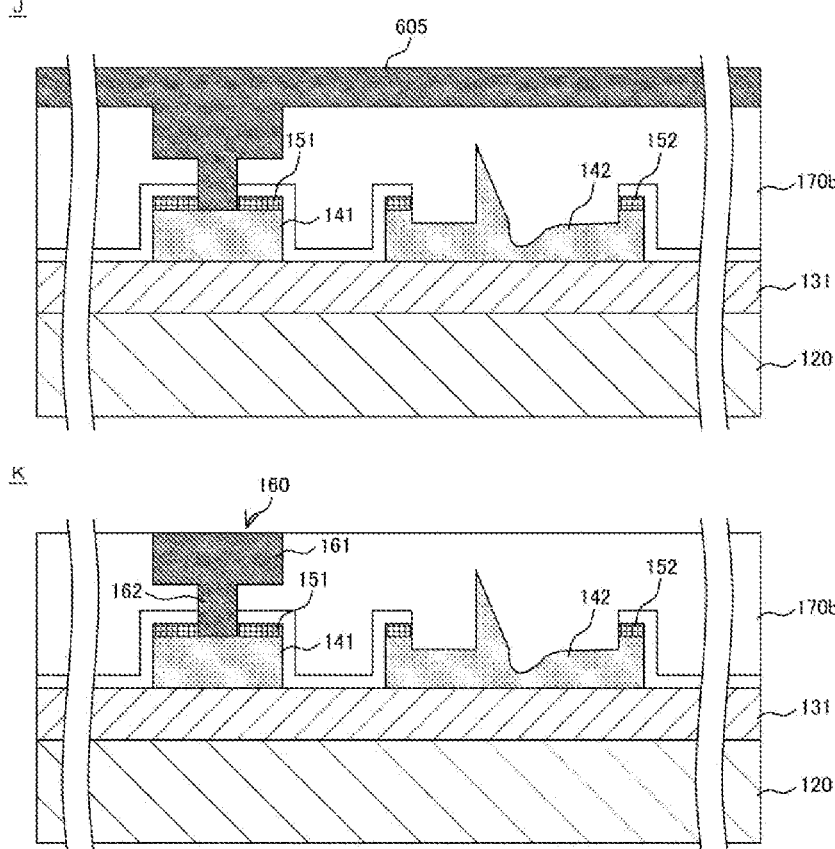
FIG. 9 is a diagram illustrating an example of a method for manufacturing an imaging chip according to the first embodiment of the present disclosure.

The protective metal film 152 in the drawing can be formed by leaving the protective metal film 152 in the etching step described with reference to E in FIG. 7. Since the protective metal film 152 is arranged on the surface of the inspection pad 142, the needle 3 of the inspection probe comes into contact with the surface of the protective metal film 152. Since the protective metal film 152 has a hardness higher than that of Al constituting the inspection pad 142, the height of the protrusion 144 can be lowered. As a result, the tip of the protrusion 144 can be separated from the front surface of the imaging chip 100. It is possible to improve the margin of the distance between the tip of the protrusion 144 and the front surface of the imaging chip 100. Further, the thickness of the insulating film 170 can be reduced, and the imaging element 1 can be made thinner.

A configuration of the imaging element 1 other than the above-described configuration is the same as the configuration of the imaging element 1 described in the first embodiment of the present disclosure and thus description thereof will be omitted.

As described above, in the imaging element 1 of the second embodiment of the present disclosure, the protective metal film 152 is arranged on the surface of the inspection pad 142 in the region with which the needle 3 of the inspection probe comes into contact. As a result, the height of the protrusion 144 of the inspection pad 142 can be lowered, and the yield at the time of manufacturing the imaging element 1 can be improved.

3. Third Embodiment

The imaging element 1 of the first embodiment described above is configured by bonding the two semiconductor chips, the imaging chip 100 and the logic chip 200. On the other hand, the imaging element 1 of the third embodiment of the present disclosure is different from the above-mentioned first embodiment in that three or more semiconductor chips are bonded to each other.

[Configuration of Imaging Element]

Figure 16:
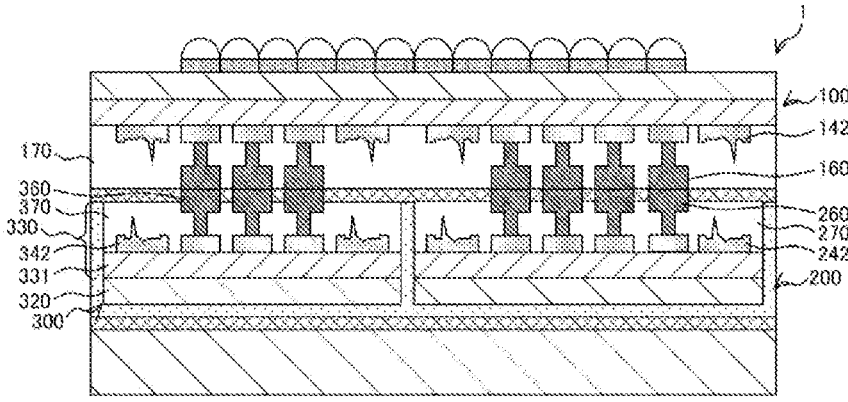
FIG. 16 is a diagram illustrating a configuration example of an imaging element according to a third embodiment of the present disclosure.

FIG. 16 is a diagram illustrating a configuration example of the imaging element according to the third embodiment of the present disclosure. The drawing is a schematic cross-sectional view illustrating a configuration example of the imaging element 1, similarly to FIG. 3. The difference from the imaging element 1 of FIG. 3 is that a semiconductor chip 300 is arranged in addition to the imaging chip 100 and the logic chip 200.

The semiconductor chip 300 is a semiconductor chip bonded to the imaging chip 100. The semiconductor chip 300 includes a semiconductor substrate 320 and a wiring region 330. An inspection pad 342, a surface pad 360, and an insulating film 370 are arranged in the wiring region 330. The inspection is performed by the inspection pad 342, and the surface pad 360 is bonded to the surface pad 160 of the imaging chip 100 at the time of bonding. In the semiconductor chip 300, for example, the vertical driving unit 60 described with reference to FIG. 2 can be arranged. In this case, the column signal processing unit 70 and the control unit 80 can be arranged on the logic chip 200. Further, other processing circuits and the like can be arranged on the semiconductor chip 300. For example, a memory circuit for storing an image signal or a circuit for performing AI (Artificial Intelligent) processing can be arranged.

The surface pad 360 is an example of a first pad described in the claims. The inspection pad 342 is an example of a second pad described in the claims.

A configuration of the imaging element 1 other than the above-described configuration is the same as the configuration of the imaging element 1 described in the first embodiment of the present disclosure and thus description thereof will be omitted.

As described above, the imaging element 1 according to the third embodiment of the present disclosure is configured by bonding three or more semiconductor chips. As a result, the size of the imaging element 1 can be reduced.

4. Fourth Embodiment

The imaging element 1 of the third embodiment described above is configured by bonding the logic chip 200 and the semiconductor chip 300 to the imaging chip 100. On the other hand, the imaging element 1 of the third embodiment of the present disclosure is different from the above-mentioned third embodiment in that the imaging chip 100, the logic chip 200, and the semiconductor chip 300 are laminated.

[Configuration of Imaging Element]

Figure 17:
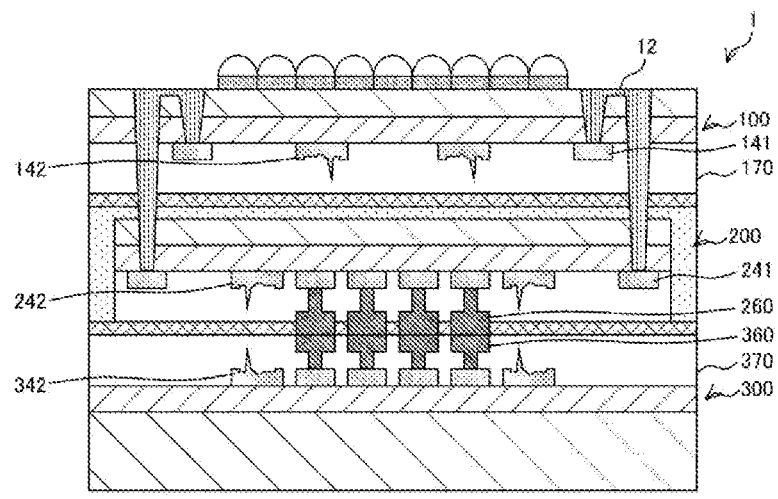
FIG. 17 is a diagram illustrating a configuration example of an imaging element according to a fourth embodiment of the present disclosure.

FIG. 17 is a diagram illustrating a configuration example of the imaging element according to the fourth embodiment of the present disclosure. The drawing is a cross-sectional view illustrating a configuration example of the imaging element 1, similarly to FIG. 16. The difference from the imaging element 1 of FIG. 16 is that the imaging chip 100, the logic chip 200, and the semiconductor chip 300 are laminated.

In the imaging element 1 of the drawing, the surface pads 260 and the surface pads 360 of the logic chip 200 and the semiconductor chip 300 are joined and bonded to each other. The imaging chip 100 is bonded to the back side of the logic chip 200. The signal transmission between the imaging chip 100 and the logic chip 200 can be performed by a twin contact 12 in which the two via-plugs are connected. One via-plug of the twin contact 12 is connected to the pad 141 of the imaging chip 100, and the other via-plug is connected to the pad 241 of the logic chip 200. Further, the two via-plugs are connected by a conductor on the surface on the back side of the imaging chip 100. In this way, the signal can be transmitted between the pad 141 of the imaging chip 100 and the pad 241 of the logic chip 200.

[Another Configuration of Imaging Element]

Figure 18:
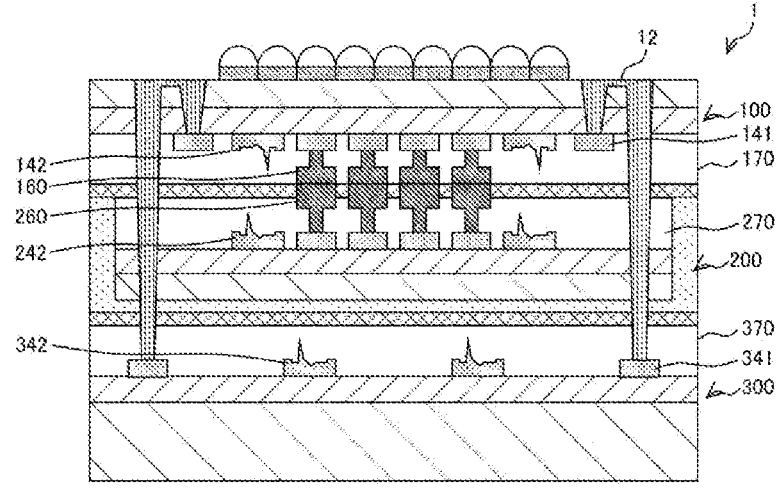
FIG. 18 is a diagram illustrating a configuration example of an imaging element according to the fourth embodiment of the present disclosure.

FIG. 18 is a diagram illustrating a configuration example of the imaging element according to the fourth embodiment of the present disclosure. The drawing is a cross-sectional view illustrating a configuration example of the imaging element 1, similarly to FIG. 17. The difference from the imaging element 1 of FIG. 17 is that the surface pads of the imaging chip 100 and the logic chip 200 are bonded to each other and the semiconductor chip 300 is bonded to the back side of the logic chip 200. The imaging element 1 in the drawing illustrates the semiconductor chip 300 arranged in place of the support substrate 400 of the imaging element 1 described with reference to FIG. 3. The pad 141 of the imaging chip and the pad 341 of the semiconductor chip 300 are connected by the twin contact 12.

A configuration of the imaging element 1 other than the aforementioned configuration is the same as the configuration of the imaging element 1 described in the third embodiment of the present disclosure and thus description thereof will be omitted.

As described above, the imaging element 1 according to the fourth embodiment of the present disclosure is configured by laminating three or more semiconductor chips. Even when semiconductor chips having substantially the same size are arranged in the imaging element 1, they can be bonded to each other.

5. Example of Application to Camera

The technology according to the present disclosure (the present technology) can be applied to various products. For example, the present technology may be realized as an imaging element mounted on an imaging device such as a camera.

Figure 19:
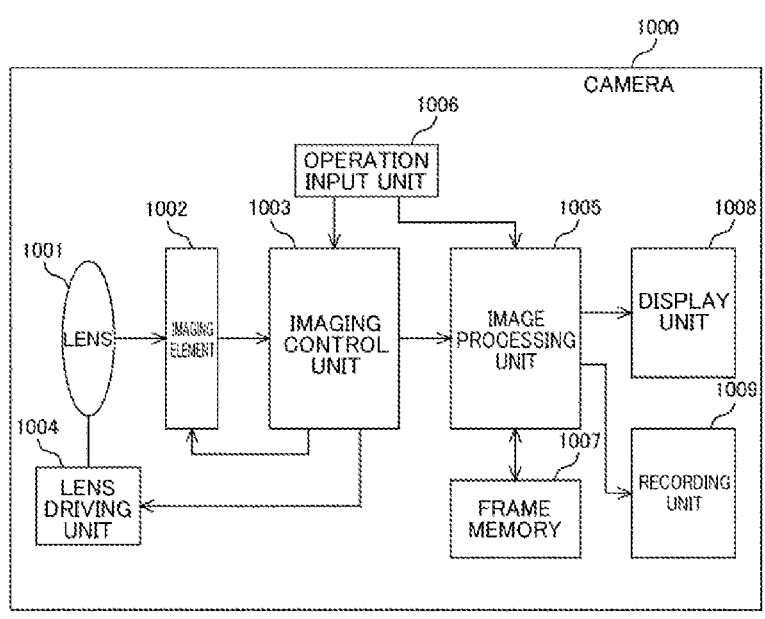
FIG. 19 is a block diagram illustrating a schematic configuration example of a camera which is an example of an imaging device to which the present technology can be applied.

FIG. 19 is a block diagram illustrating a schematic configuration example of a camera which is an example of an imaging device to which the present technology is applicable. A camera 1000 in the drawing includes a lens 1001, an imaging element 1002, an imaging control unit 1003, a lens driving unit 1004, an image processing unit 1005, an operation input unit 1006, a frame memory 1007, a display unit 1008, and a recording unit 1009.

The lens 1001 is an imaging lens of the camera 1000. The lens 1001 focuses light from a subject, causing the light to be incident on the imaging element 1002, which will be described later, and forms an image of the subject.

The imaging element 1002 is a semiconductor element that images the light from the subject focused by the lens 1001. The imaging element 1002 generates an analog image signal corresponding to emitted light, converts the analog image signal into a digital image signal, and outputs the digital image signal.

The imaging control unit 1003 controls imaging in the imaging element 1002. The imaging control unit 1003 controls the imaging element 1002 by generating a control signal and outputting the control signal to the imaging element 1002. In addition, the imaging control unit 1003 can perform auto-focus in the camera 1000 on the basis of an image signal output from the imaging element 1002. Here, the auto-focus is a system that detects a focal position of the lens 1001 and automatically adjusts the focal position. As the auto-focus, a method of detecting an image surface phase difference according to phase difference pixels disposed in the imaging element 1002 to detect a focal position (image surface phase difference auto-focus) can be used. In addition, a method of detecting a position at which the contrast of an image is maximized as a focal position (contrast auto-focus) can also be applied. The imaging control unit 1003 adjusts the position of the lens 1001 through the lens driving unit 1004 on the basis of the detected focal position and performs auto-focus. Meanwhile, the imaging control unit 1003 can be configured as, for example, a digital signal processor (DSP) provided with firmware.

The lens driving unit 1004 drives the lens 1001 on the basis of control by the imaging control unit 1003. The lens driving unit 1004 can drive the lens 1001 by changing the position of the lens 1001 using a built-in motor.

The image processing unit 1005 processes an image signal generated by the imaging element 1002. This processing corresponds to, for example, demosaicing for generating an image signal of an insufficient color among image signals corresponding to red, green, and blue for each pixel, noise reduction for removing noise in an image signal, image signal encoding, and the like. The image processing unit 1005 can be constituted by, for example, a microcomputer provided with firmware.

The operation input unit 1006 receives an operation input from a user of the camera 1000. For example, a pushbutton or a touch panel can be used as the operation input unit 1006. An operation input received by the operation input unit 1006 is transmitted to the imaging control unit 1003 and the image processing unit 1005. Thereafter, processing corresponding to the operation input, for example, processing such as imaging of a subject is started.

A frame memory 1007 is memory that stores a frame which is an image signal corresponding to one screen. The frame memory 1007 is controlled by the image processing unit 1005 and holds frames during image processing.

The display unit 1008 displays an image processed by the image processing unit 1005. For example, a liquid crystal panel can be used as the display unit 1008.

The recording unit 1009 records an image processed by the image processing unit 1005. For example, a memory card or a hard disk can be used as the recording unit 1009.

A camera to which the present disclosure can be applied has been described above. The present technique can be applied to the imaging element 1002 among the components described above. Specifically, the imaging element 1 illustrated in FIG. 1 can be applied to the imaging element 1002.

The configuration of the inspection pad 142 of the second embodiment can be combined with other configurations. Specifically, the protective metal film 152 of FIG. 15 can be applied to the inspection pads 142 and the like of FIGS. 16 to 18.

Finally, the descriptions of the above-described embodiments are merely examples of the present disclosure, and the present disclosure is not limited to the above-described embodiments. Therefore, it goes without saying that various changes aside from the above-described embodiments can be made according to the design and the like within a scope that does not depart from the technical spirit of the present disclosure.

Additionally, the effects described in the present specification are merely examples, and are not limiting. Other effects may be obtained as well.

In addition, the drawings in the above-described embodiments are schematic, and dimensional ratios and the like of respective parts are not necessarily consistent with actual ones. In addition, the drawings of course include parts where dimensional relationships and ratios differ from drawing to drawing.

The present technique can also have the following configurations.

(1) An imaging element including: a plurality of semiconductor chips each having a semiconductor substrate and a wiring region and bonded to each other, wherein one of the plurality of semiconductor chips is provided with a photoelectric conversion unit for performing photoelectric conversion of incident light, two of the plurality of semiconductor chips are provided with first pads in which surfaces of wiring regions of the two semiconductor chips are bonded to each other and which are arranged on the surfaces of the wiring regions and bonded to each other at the time of the bonding, and at least one of the two semiconductor chips is provided with a second pad arranged in the wiring region and having a protrusion formed thereon so as to face toward the bonded surface, and the second pad is configured to have a size different from that of the first pad.

(2) The imaging element according to (1), wherein the second pad is configured to have a size larger than that of the first pad.

(3) The imaging element according to (1) or (2), further including: an insulating film arranged between the second pad and the bonded surface.

(4) The imaging element according to (3), wherein the insulating film has an insulating material made of a silicon compound.

(5) The imaging element according to any one of (1) to (4), further including: a protective metal film arranged on a surface of the second pad.

(6) The imaging element according to any one of (1) to (5), wherein at least one of the plurality of semiconductor chips further includes a third pad for connecting to an external circuit.

(7) The imaging element according to (6), wherein the third pad is arranged in the same layer as the second pad.

(8) The imaging element according to any one of (1) to (7), wherein the second pad is made of aluminum.

(9) The imaging element according to any one of (1) to (8), wherein the second pad has the protrusion formed by inspection with a probing needle.

(10) The imaging element according to any one of (1) to (9), wherein the second pad has a protrusion formed in a recess arranged on the bonded surface.

(11) The imaging element according to any one of (1) to (10), wherein the two semiconductor chips among the plurality of semiconductor chips include respectively the second pads arranged so as to face each other.

(12) The imaging element according to any one of (1) to (11), wherein the first pad is made of copper.

(13) The imaging element according to any one of (1) to (12), wherein the photoelectric conversion unit is configured to perform photoelectric conversion of the incident light irradiated on a surface different from the surface on which the wiring region of the semiconductor chip is arranged.

(14) The imaging element according to any one of (1) to (13), wherein at least one of the plurality of semiconductor chips is provided with a processing circuit configured to process an image signal generated based on the photoelectric conversion.

(15) The imaging element according to (14), wherein the two semiconductor chips among the plurality of semiconductor chips are respectively provided with the processing circuits and bonded to each other.

(16) A method for manufacturing an imaging element, including: a photoelectric conversion unit arrangement step of arranging a photoelectric conversion unit that performs photoelectric conversion of incident light on a semiconductor substrate; a second pad arrangement step of arranging a second pad in a wiring region, the second pad having a protrusion facing toward a bonded surface when wiring regions arranged on two semiconductor substrates are bonded; a first pad arrangement step of arranging first pads on the surface of the wiring region on which the second pad is arranged, the first pads being bonded to each other at the time of the bonding and having a size different from that of the second pad; a bonding step in which the wiring regions of the two semiconductor chips on which the first pads are arranged are bonded to each other and the first pads are bonded to each other.

(17) The method for manufacturing the imaging element according to (16), further including: an inspection step of performing inspection with the arranged second pad and forming the protrusion by the inspection, wherein the first pad arrangement step involves arranging the first pads on the wiring region on which the second pad, on which the inspection has been performed, is arranged.

REFERENCE SIGNS LIST 1, 1002 Imaging element
15, 16 Oxide film bonding layer
19 Oxide film
50 Pixel array portion
60 Vertical driving unit
70 Column signal processing unit
80 Control unit
100 Imaging chip
110 Pixel
120, 220, 320 Semiconductor substrate
130, 230, 330 Wiring region
141, 161, 241, 341 Pad
142, 242, 342 Inspection pad
143 Recess
148, 248 Bonding pad
149 Simulated pad
151, 152, 158, 159 Protective metal film
160, 260, 360 Surface pad
162 Via-plug
170, 170a, 170b, 270 Insulating film
200 Logic chip
300 Semiconductor chip

What is claimed is:
1. An imaging element, comprising:
a plurality of semiconductor chips each having a semiconductor substrate and a wiring region and bonded to each other,
wherein one of the plurality of semiconductor chips is provided with a photoelectric conversion unit for performing photoelectric conversion of incident light,
wherein two of the plurality of semiconductor chips are provided with first pads,
wherein first surfaces of wiring regions of the two semiconductor chips are bonded to each other,
wherein the first pads are arranged on the first surfaces of the wiring regions and are bonded to each other, wherein at least a first one of the two semiconductor chips is provided with a second pad on a second surface of the wiring region of the first one of the two semiconductor chips,
wherein the second pad has a protrusion formed thereon so as to face toward the bonded surface,
wherein the second surface of the wiring region of the first one the two semiconductor chips is opposite the first surface of the wiring region of the first one of the two semiconductor chips,
wherein the protrusion of the second pad of the first one of the two semiconductor chips extends to a point between the first and second surfaces of the wiring region of the first one of the two semiconductor chips and is spaced apart from the first surface of the wiring region of the first one of the two semiconductor chips,
wherein a side surface of the first pad of the first one of the two semiconductor chips, a side surface of the second pad of the first one of the two semiconductor chips, and the protrusion of the second pad of the first one of the two semiconductor chips are formed in a same insulating film layer, and
wherein the second pad is configured to have a size different from a size of the first pad.
2. The imaging element according to claim 1, wherein the second pad is configured to have a size larger than that of the first pad.
3. The imaging element according to claim 1, further comprising:
an insulating film arranged between the second pad and the bonded surface.
4. The imaging element according to claim 3, wherein the insulating film has an insulating material made of a silicon compound.
5. The imaging element according to claim 1, further comprising:
a protective metal film arranged on a surface of the second pad.
6. The imaging element according to claim 1, wherein at least one of the plurality of semiconductor chips further includes a third pad for connecting to an external circuit.
7. The imaging element according to claim 6, wherein the third pad is arranged in a same layer as the second pad.
8. The imaging element according to claim 1, wherein the second pad is made of aluminum.
9. The imaging element according to claim 1, wherein the second pad has the protrusion formed by inspection with a probing needle.
10. The imaging element according to claim 1, wherein the second pad has the protrusion formed in a recess arranged on the bonded surface.
11. The imaging element according to claim 1,
wherein the second one of the two semiconductor chips is provided with a second pad, and
wherein the second pads of the first and second semiconductor chips face each other.
12. The imaging element according to claim 1, wherein the first pad is made of copper.
13. The imaging element according to claim 1, wherein the photoelectric conversion unit is configured to perform photoelectric conversion of the incident light irradiated on a surface different from the surface on which the wiring region of the semiconductor chip is arranged.

14. The imaging element according to claim 1, wherein at least one of the plurality of semiconductor chips is provided with a processing circuit configured to process an image signal generated based on the photoelectric conversion.

15. The imaging element according to claim 14, wherein the two semiconductor chips among the plurality of semiconductor chips are respectively provided with the processing circuits and bonded to each other.

16. The imaging element according to claim 1, wherein a third pad arranged on the second surface of the wiring region of the first one of the two semiconductor chips, and wherein an opening is adjacent a back surface of the third pad.

17. A method for manufacturing an imaging element, comprising:

a photoelectric conversion unit arrangement step of arranging a photoelectric conversion unit that performs photoelectric conversion of incident light on a semiconductor substrate;

a second pad arrangement step of arranging a second pad in a wiring region, the second pad having a protrusion facing toward a bonded surface when wiring regions arranged on two semiconductor substrates are bonded;

a first pad arrangement step of arranging first pads on the surface of the wiring region on which the second pad is arranged, the first pads being bonded to each other and having a size different from that of the second pad;

a bonding step in which the wiring regions of the two semiconductor substrates on which the first pads are arranged are bonded to each other and the first pads are bonded to each other; and an inspection step of performing an inspection with the arranged second pad and forming the protrusion by the inspection, wherein the first pad arrangement step involves arranging the first pads on the wiring region, on which the second pad on which the inspection has been performed, is arranged.

* * * * *